(12) United States Patent
Göbl et al.

(10) Patent No.: US 6,979,204 B2
(45) Date of Patent: Dec. 27, 2005

(54) PRESSURE PIECE FOR USE IN A POWER SEMICONDUCTOR MODULE

(75) Inventors: Christian Göbl, Nürnberg (DE); Rainer Popp, Petersaurach (DE); Marco Lederer, Nürnberg (DE)

(73) Assignee: Semikron Elektronik GmbH & Co. KG, Nürnberg (DE)

( * ) Notice: Subject to any disclaimer, the term of this patent is extended or adjusted under 35 U.S.C. 154(b) by 0 days.

(21) Appl. No.: 10/780,981

(22) Filed: Feb. 18, 2004

(65) Prior Publication Data

US 2004/0242031 A1 Dec. 2, 2004

(30) Foreign Application Priority Data

Feb. 18, 2003 (DE) .............................. 103 06 643

(51) Int. Cl.[7] .......................................... H01R 12/00
(52) U.S. Cl. ....................................................... 439/73
(58) Field of Search ..................... 439/68–73

(56) References Cited

U.S. PATENT DOCUMENTS 5,409,419 A    4/1995  Euchner et al.
5,653,397 A    8/1997  Park
5,793,618 A *  8/1998  Chan et al. ................. 361/809
6,454,587 B1   9/2002  Malone

FOREIGN PATENT DOCUMENTS

DE   196 30 173 A1   1/1998
DE   198 47 029 A1   4/2000
DE   199 03 875 A1   8/2000

* cited by examiner

Primary Examiner—Ross Gushi
(74) Attorney, Agent, or Firm—Cohen, Pontani, Lieberman & Pavane

(57) ABSTRACT

A pressure piece for a compact power semiconductor module for direct mounting on a heat sink. The power semiconductor module has resilient connection leads for electrical connection to a printed circuit board disposed outside the housing. The pressure piece is dimensionally stable and effects pressure-contact between the printed circuit board and the connection leads. On its primary face facing the printed circuit board, the pressure piece has a plurality of pressure elements that space the primary face from the printed circuit board. In a preferred embodiment at least one rib includes a notch. Preferably, the pressure piece has at least one opening connecting its two primary faces permitting fluid flow between the edge of the pressure element and the notch.

7 Claims, 3 Drawing Sheets

PRESSURE PIECE FOR USE IN A POWER SEMICONDUCTOR MODULE

BACKGROUND OF THE INVENTION

1. Field of the Invention

The invention is directed to compact power semiconductor modules, and, more particularly, to an arrangement in which a pressure piece exerts pressure on a printed circuit board to effect electrical and thermal contact in the module, while permitting the placement of electrical components on the face of a printed circuit board underneath the pressure piece.

2. Background of the Prior Art.

Modern designs for such power semiconductor modules with high power in proportion to their structural size, which are the point of departure of the present invention, are known from German Patent DE 196 30 173 C2 or German Patent DE 199 24 993 C2.

German Patent DE 196 30 173 C2 discloses a power semiconductor module for direct mounting on a heat sink, comprising a housing and an electrically insulating substrate which in turn comprises an insulator body with a plurality of metal connecting tracks, insulated from one another and located on the insulator body, and power semiconductor components located on the connection tracks and connected to these connection tracks with appropriate circuitry. The external electrical connection to a printed circuit board disposed outside the housing is accomplished by means of at least partly resilient connection leads.

The power semiconductor module furthermore has at least one centrally located recess through which a screw connection can pass. The screw connection serves, together with a dimensionally stable pressure piece disposed on the side of the printed circuit board remote from the power semiconductor module and resting flatly on the printed circuit board, to provide the pressure contact of the module. This pressure contact performs two tasks simultaneously: first, making secure electrical contact between the connection elements and the printed circuit board, and second, making thermal contact between the module and a heat sink, both kinds of contact being releasable.

A disadvantage of these known power semiconductor modules is that the known pressure piece does not allow further components, such as resistors, capacitors or integrated circuits, to be disposed on the part of the printed circuit board that is covered by the pressure piece.

German Patent DE 199 24 993 C2, for example, shows power semiconductor modules in which the connection elements are extended from the power semiconductor module to a printed circuit board in the form of soldered pins. These soldered pins serve as both control and load connection leads for electrically connecting the power semiconductor components within the power semiconductor to the supply lines disposed on the printed circuit board. Thus, the power semiconductor module can be connected either directly to a printed circuit board or, as disclosed in DE 199 24 993 C2, indirectly by means of an adapter board. The thermal contact between the power semiconductor module and a heat sink is established by means of screw connections, independent of the electrical contacts.

A disadvantage of the design of such power semiconductor modules is that integrating the module into a higher-order system requires the use of two different connecting techniques (screw and soldered connections), which must be accomplished in multiple manufacturing steps. A particular disadvantage here is that the contact security of the soldered connections is not assured over the service life, and that the soldered connection does not enable replacing the power semiconductor module except at significant effort and expense.

SUMMARY OF THE INVENTION

The object of the present invention is to provide an arrangement for a power semiconductor module, with connection leads embodied at least partly resiliently therein, for releasably electrically connecting the connection tracks to a printed circuit board located outside the housing of the module, and having at least one dimensionally stable pressure piece for pressure-contacting the printed circuit board to the connection leads. The pressure piece simultaneously allows both the placement of components on the printed circuit board and their cooling.

This object is attained by an arrangement as defined by claim 1, and special features are defined by the dependent claims.

The fundamental concept of the invention is based on a power semiconductor component with a substrate or for direct mounting on a heat sink in accordance with the prior art comprising a housing with at least one electrically insulating substrate disposed inside it. This substrate in turn comprises, first, an insulator body with a plurality of metal connection tracks, insulated from one another and located on its first primary face, and, second, preferably a two-dimensional metal layer disposed on its second primary face. A plurality of power semiconductor components are disposed on the connection tracks of the first primary face and are connected by appropriate circuitry to these connection tracks.

As connection elements for load and control terminals, the power semiconductor module has connection leads which are designed to be at least partly resilient. These connection leads electrically connect the connection tracks to a printed circuit board located outside the housing and to the external connection tracks disposed on the printed circuit board. The secure electrical contact between the connection leads and the external connection tracks of the printed circuit board is achieved by means of an arrangement for pressure contact in the semiconductor module. The introduction of pressure in this arrangement is effected by means of at least one dimensionally stable pressure piece, connected to the base plate or to the heat sink; this connection is preferably made by means of a screw connection. The result is accordingly a construction which comprises a pressure piece, a printed circuit board, the power semiconductor module, and a base plate or a heat sink.

On its second primary face, that is, the primary face facing toward the printed circuit board, the embodiment of the pressure piece according to the invention has a plurality of individual pressure elements or interconnected pressure elements. These pressure elements space the second primary face of the pressure element from the printed circuit board in such a way that components, such as resistors, capacitors, and/or integrated circuits, can be disposed on the first primary face, oriented toward the pressure piece, of the printed circuit board.

Preferably, the pressure elements are disposed such that they press against the printed circuit board at or near where the contact points of the connection leads on the opposite primary face are located.

It is thus advantageous in the design of the power semiconductor module of the invention that components can be disposed in the region of the printed circuit board past which the pressure piece protrudes; thus the total space required by this printed circuit board is less, because of better utilization, than in an arrangement of the prior art.

Preferably, the pressure piece is embodied such that it has at least one opening connecting its two primary faces, and the pressure elements are disposed such that a convection flow from at least one edge of the pressure element to this opening is possible. This is advantageous because as a result, the components disposed between the printed circuit board and the pressure piece are effectively cooled.

The invention will be described in further detail in terms of exemplary embodiments in conjunction with FIGS. 1–3.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
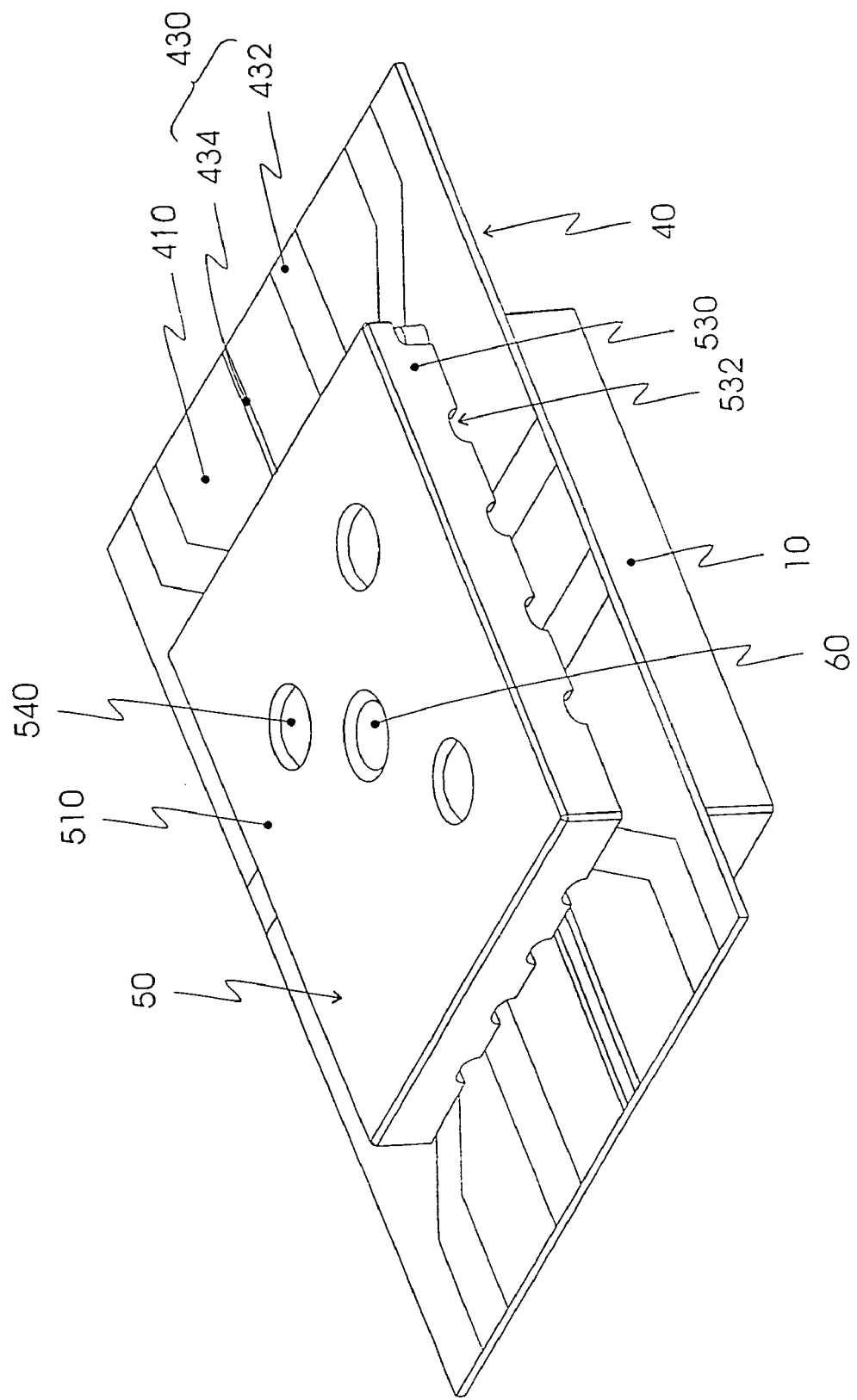
FIG. 1 is a three-dimensional view of a power semiconductor module with a pressure piece of the invention.

FIG. 1 shows a three-dimensional view of a power semiconductor module with a pressure piece according to the invention. The power semiconductor module, or its housing 10, is disposed under a printed circuit board 40. The printed circuit board 40, facing toward housing 10, includes a first primary face (410; shown in FIG. 2), and a second primary face which includes external connection tracks 430, which are embodied as load-current connection tracks 432 and/or auxiliary or control connection tracks 434. By means of contact faces and/or throughplating of the printed circuit board 40, a plurality of these terminal tracks contact the connection leads (not separately shown) of the power semiconductor module.

Figure 2:
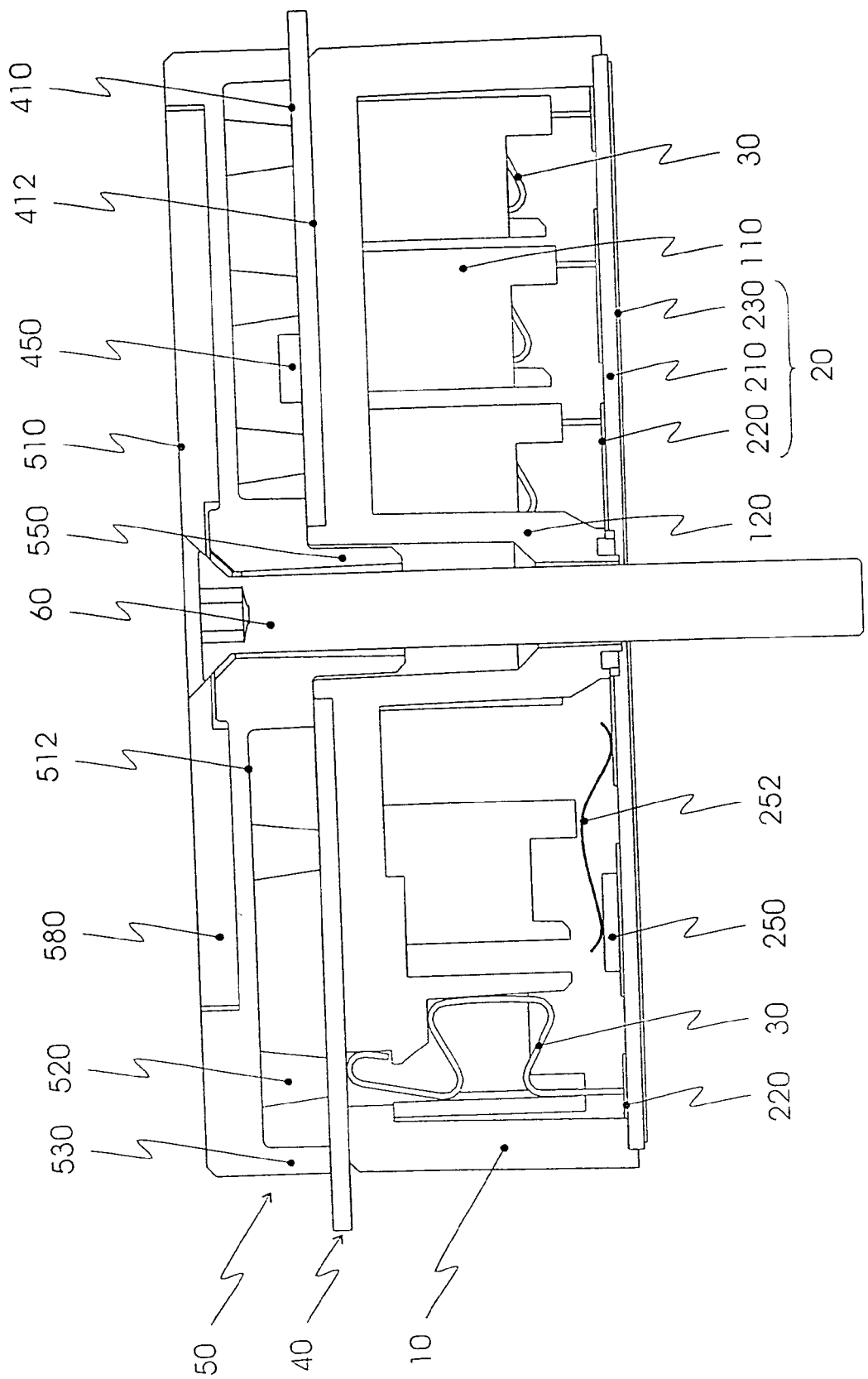
FIG. 2 is a section through a power semiconductor module with the pressure piece of the invention.

A pressure piece 50 comprising an electrically insulating, dimensionally stable plastic is disposed on the first primary face 410 of the printed circuit board 40 and is connected to a heat sink (not shown) by means of a screw connection 60, which passes through openings in the printed circuit board 40, the housing 10 and a substrate 20 (FIG. 2). By means of this connection, the pressure-contacting of the electrical terminals between the printed circuit board 40 and the connection leads 430 and the thermal contact between the substrate 20 and the heat sink are established. For spacing its second primary face, toward the printed circuit board 40, apart from this printed circuit board, the pressure piece 50 has riblike pressure elements 530, which by being joined together form a frame in this case. It is thus possible to dispose components, such as capacitors, between the first primary face 410 of the printed circuit board 40 and the second primary face of the pressure piece 50. For cooling these components, the riblike pressure elements 530 have notches 532. A cooling fluid, such as air, can flow through these notches 532 to beneath the pressure piece 50. The opening 540 that connect the two primary faces 510, 512 of the pressure piece improves the cooling action by means of a convection flow from the notches 532 to these opening 540.

FIG. 2 shows a section through a power semiconductor module for direct mounting on a heat sink, not shown, and a pressure piece 50 of the invention. The power semiconductor component comprises a housing 10, with at least one electrically insulating substrate 20 disposed therein, preferably a so-called DCB (direct copper bonding) substrate of the prior art. This substrate 20 in turn comprises a ceramic insulator body 210, with a plurality of metal connection tracks 220 insulated from one another and located on its first primary face, as well as a two-dimensional metal layer 230 disposed on its second primary face. A plurality of power semiconductor components 250 are disposed on the connection tracks 220 of the first primary face and are connected to them by appropriate circuitry by means of wire bond connections 252.

As connection elements for both load and control terminals, the power semiconductor module has connection leads 30 designed to be at least partly resilient. These connection leads are disposed in guides 110 inside the housing 10. The connection leads 30 make the electrical connection of the connection tracks 220 with a printed circuit board 40, disposed outside the housing 10, and with the external connection tracks 430 disposed on that printed circuit board 41 (FIG. 1). The secure electrical contact between the connection leads 30 and the external connection tracks of the printed circuit board 40 is achieved in each case by means of a pressure contact arrangement. The pressure introduction in this arrangement is effected by means of a dimensionally stable pressure piece 50, which is connected to a heat sink disposed beneath the substrate but not shown. This connection is embodied as screw connection 60, and the housing 10 has a guide 120 for this screw connection.

The pressure piece 50 applies pressure to the various compounds to effect electrical connection between the connection leads (430; see FIG. 1), the printed circuit board 40, and the connection leads 30, as well as between the connection leads 30 and the conductor tracks 220 of the substrate 20 and also serves to establish thermal contact between the substrate 20 and the heat sink. To that end, on its second primary face 512 oriented toward the printed circuit board, the pressure piece 50 has a plurality of individual and/or interconnected pressure elements 520, 530. These pressure elements can, for example, be embodied as ribs 530 or prongs 520. By means of these pressure elements 520, 530, the second primary face 512 of the pressure piece 50 is spaced from the first primary face 410 of the printed circuit board 40 in such a way that components 450, such as resistors, capacitors and/or integrated circuits, can be disposed on this first primary face 410, of the printed circuit board 40 facing the pressure piece 50.

The pressure elements 520, 530 themselves are disposed such that on the one hand they press against the printed circuit board 40 at or near those points where the contact points of the connection leads 30 are disposed on the opposite, second primary face 412, and on the other hand, they form a frame, which presses against the edge of the housing 10 via the printed circuit board. In addition, the pressure piece 50 has a sheath 550 for electrically insulating the screw connection 60 from the pressure piece 50 and the heat sink.

The pressure piece 50 comprises a composite of a dimensionally stable, electrically insulating plastic and a metal core 580; the metal core 580 is injected into the plastic and thus can be encased by it or retained in a recess therein. This assures the stability of the arrangement, while resulting in an only slight thickness, between the two primary faces 510, 512 of the pressure piece 50. Alternatively or additionally, riblike reinforcing structures may be disposed on the first primary face 510.

Figure 3:
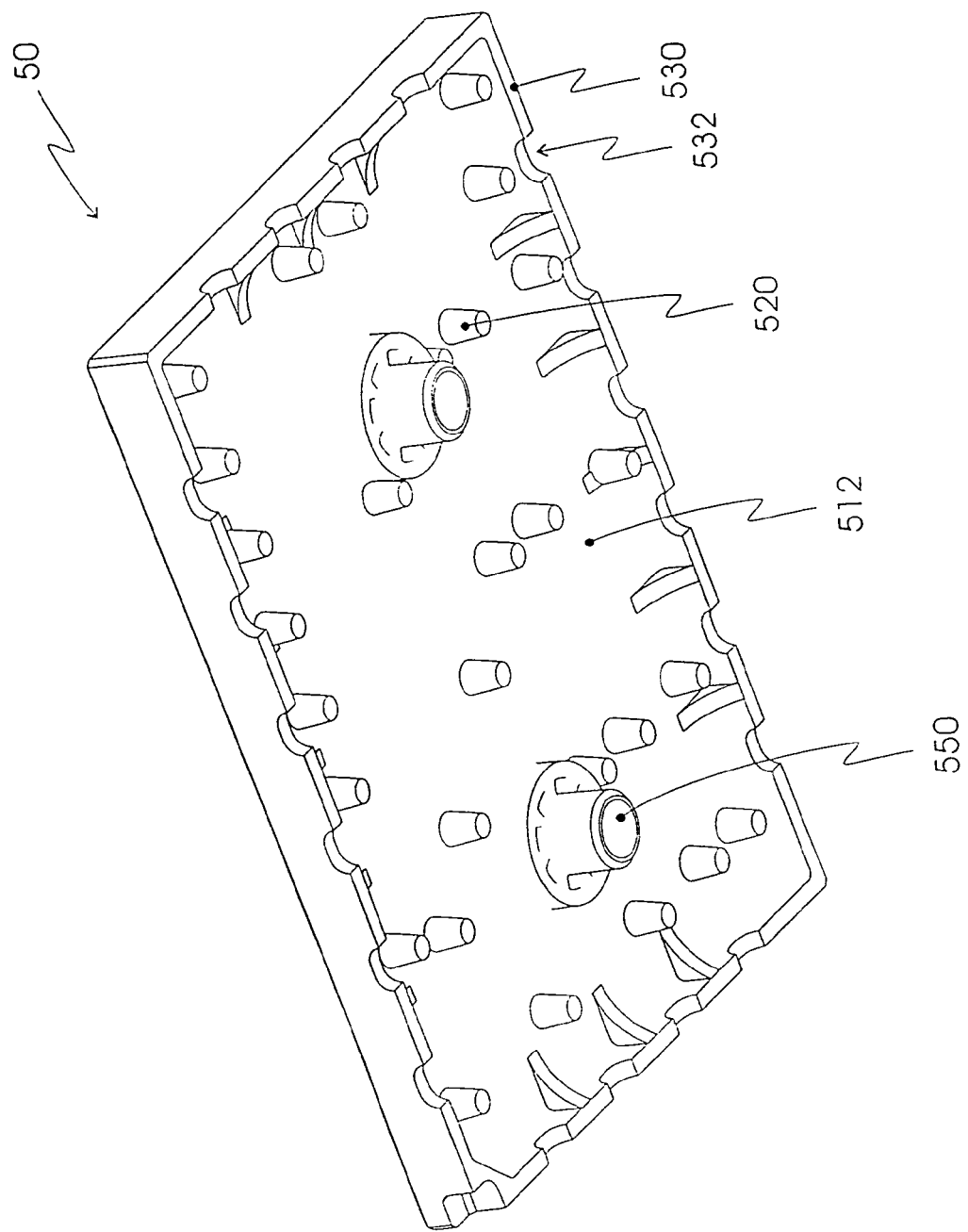
FIG. 3 is a perspective of a further embodiment of a pressure piece of the invention.

FIG. 3, in a perspective view, shows a further embodiment of a pressure piece 50 of the invention, looking toward the second primary face 512. On this second primary face 512, the pressure piece 50 has a plurality of pronglike pressure elements 520. The riblike pressure elements 530 disposed in the same way are connected, and because of their arrangement they form one edge of the pressure piece. These riblike pressure pieces 530 also have notches 532, which act as openings for the passage therethrough of a cooling fluid, such as air, over components disposed in the region underneath the first primary face 512 of the pressure elements 530.

The pressure piece 50 furthermore has two sheaths 550 for receiving screw connections. A plurality of such screw connections is useful, in power semiconductor modules of greater than a certain size, in order to assure a secure introduction of pressure for both electrical contacting and for thermal contacting of the elements of the arrangement.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A pressure piece for effecting pressure contact within a power semiconductor module, the module includes a housing, at least one electrically insulating substrate having an insulating body with a plurality of metal connection tracks located therein and insulated from one another, at least one power semiconductor component located on and electrically connected to the connection tracks and at least partially resilient connection leads, for electrically connecting the connection tracks to a printed circuit board disposed outside the housing,
wherein the pressure piece is dimensionally stable and includes a plurality of pressure elements disposed on a first primary face of the pressure piece facing the printed circuit board, and the pressure elements space the primary face from the printed circuit board; and
wherein the pressure piece comprises a composite of an electrically insulating plastic and a metal core.

2. A pressure piece for effecting pressure contact within a power semiconductor module, the module includes a housing, at least one electrically insulating substrate having an insulating body with a plurality of metal connection tracks located therein and insulated from one another, at least one power semiconductor component located on and electrically connected to the connection tracks and at least partially resilient connection leads, for electrically connecting the connection tracks to a printed circuit board disposed outside the housing;
wherein the pressure piece is dimensionally stable and includes a plurality of pressure elements disposed on a first primary face of the pressure piece facing the printed circuit board, and the pressure elements space the primary face from the printed circuit board; and
wherein the pressure piece has at least one electrically insulated sheath for receiving a screw connection.

3. A pressure piece for effecting pressure contact within a power semiconductor module, the module includes a housing, at least one electrically insulating substrate having an insulating body with a plurality of metal connection tracks located therein and insulated from one another, at least one power semiconductor component located on and electrically connected to the connection tracks and at least partially resilient connection leads, for electrically connecting the connection tracks to a printed circuit board disposed outside the housing,
wherein the pressure piece is dimensionally stable and includes a plurality of pressure elements disposed on a first primary face of the pressure piece facing the printed circuit board, and the pressure elements space the primary face from the printed circuit board; and
wherein the plurality of pressure elements includes at least one prong.

4. The pressure piece of claim 3, wherein the pressure piece comprises an electrically insulating, dimensionally stable, plastic.

5. A pressure piece for effecting pressure contact within a power semiconductor module, the module includes a housing, at least one electrically insulating substrate having an insulating body with a plurality of metal connection tracks located therein and insulated from one another, at least one power semiconductor component located on and electrically connected to the connection tracks and at least partially resilient connection leads, for electrically connecting the connection tracks to a printed circuit board disposed outside the housing;
wherein the pressure piece is dimensionally stable and includes a plurality of pressure elements disposed on a first primary face of the pressure piece facing the printed circuit board, and the pressure elements space the primary face from the printed circuit board; and
wherein the plurality of pressure elements includes at least one rib.

6. The pressure piece of claim 5, wherein the plurality of pressure elements includes at least two ribs which form a frame.

7. The pressure piece of claim 5, wherein the at least one rib has at least one notch to permit fluid to flow therethrough.

* * * * *